United States Patent Office 3,453,110
Patented July 1, 1969

3,453,110
PHOTOCHEMICAL CROSS-LINKING OF POLYMERS

Gerard Albert Delzenne and Urbain Leopold Laridon, Wilrijk-Antwerp, Belgium, assignors to Gevaert-Agfa N.V., Mortsel, Belgium, a Belgian company No Drawing. Filed Aug. 30, 1965, Ser. No. 483,871
Claims priority, application Great Britain, Sept. 2, 1964, 35,970/64
Int. Cl. G03c *1/68, 5/00*
U.S. Cl. 96—36.3 10 Claims

ABSTRACT OF THE DISCLOSURE

A process of producing a printing element and the printing element obtained is described comprising exposing select portions of a light-sensitive polymeric composition carrying coumarin substituents to actinic light whereby in the exposed areas the polymer in cross-linked to the insoluble state and thereafter removing the soluble polymer in the unexposed areas.

The present invention relates to a process for photochemically decreasing the solubility of polymers, to the production of printing plates and resist images, and to printing plates and resist images obtained by this process.

It is known that layers which are applied to a support and consist of, e.g., poly(vinyl cinnamate) can be hardened by exposure to light. If the exposure happens not to be uniform all over the layer and only selected portions are exposed, the poly(vinyl cinnamate) becomes insoluble at the exposed areas whereas the poly(vinyl cinnamate) remaining soluble at the unexposed areas can be washed away. In this manner a relief image is left on the support and this relief image can be employed as such for printing purposes. If the support happens to be a metal plate, e.g., a copper plate, the relief image may serve as an etching resist for the production of resist images.

A new class of light-sensitive polymers has been found now. One object of the invention is to provide a process for the photochemical insolubilization of soluble high-molecular weight light-sensitive polymers. Another object is to provide light-sensitive materials for use in the production of photographic resists and photographic printing plates. A further object is to provide methods of making photographic relief images from high-molecular weight light-sensitive polymers. Other objects will appear from the following description and claims.

The process for the photochemical insolubilization of polymers in accordance with the invention comprises exposing to actinic light selected portions of a light-sensitive polymeric composition consisting of or comprising (e.g., consisting mainly of) a soluble polymeric material carrying coumarin substituents.

The light-sensitive, soluble, high-molecular weight polymers carrying coumarin substituents are obtained by homopolymerization or copolymerization of one or more unsaturated monomers comprising coumarin groups, e.g., by homopolymerization or copolymerization of 7-acrylyloxycoumarin. In the case of copolymerization products one or more comonomers may, e.g., be chosen from styrene and its nuclear substitution derivatives, vinyl chloride, vinylidene chloride, vinyl esters, vinyl ethers, acrylic and methacrylic acid esters, acrylonitrile, methacrylonitrile, butadiene, and like compounds. Any comonomer can be selected so that its incorporation into the synthetic polymerization product imparts required physical properties thereto, as, e.g., in the case of the listed comonomers optimal strength and hardness after exposure to light and insolubilization.

In the same way a certain amount of plurality unsaturated monomeric groups such as divinyl benzene, diglycol diacrylates, N,N'-alkylene-bisacrylamides, N,N'-diallylacrylamide, ethylene diacrylate, and triallyl cyanurate may be present in the copolymer provided that the light-sensitive layer remains soluble when not affected by actinic light.

The polymers carrying coumarin substitutents may also be obtained by polycondensation of intermediates at least one of which carries a coumarin substituent, e.g., by polycondensation of 2,2-bis(4-hydroxyphenyl)propane with 6-[3,5-di(chlorocarbonyl)phenoxysulphonyl]coumarin.

The polymers carrying coumarin substituents may also be obtained by reaction of coumarin group-containing compounds with polymeric materials. These polymeric materials may be natural polymers, chemically modified natural polymers, synthetic polymerization products, polycondensation products, or polyaddition products as long as they possess in their structure groups capable of reacting with the coumarin derivatives.

Among the natural polymers may be mentioned cellulose, starch, dextrin and the like, and their partial esters and ethers provided that they contain in their structure a substantial amount of free hydroxyl groups.

Synthetic polymerization products, which can be reacted with one or more coumarin group-containing compounds, are, e.g., poly(vinyl alcohol), partly acetalized or esterified poly(vinyl alcohol), and copolymers comprising in their structure a substantial amount of vinyl alcohol units. In this case also one or more other monomers may be reacted for influencing physical or other properties, e.g., a monomer chosen among styrene, vinyl chloride and the other comonomers listed above which promote strength and hardness of the final polymeric material after exposure to light and cross-linking. In the same way as described above it is also possible to incorporate a certain amount of plurally unsaturated monomeric units, e.g., divinylbenzene.

Synthetic condensation products carrying groups capable of reacting with coumarin group-containing compounds are for instance polyamides carrying hydroxymethyl or hydroxyethyl substituents, and epoxy resins such as the polyether obtained by polycondensation of 2, 2-bis(4-hydroxyphenyl)propane and epichlorhydrin.

The above-mentioned natural and synthetic polymeric materials are reactive with coumarin derivatives, for they all possess free hydroxyl groups in their polymeric structure. Natural and synthetic polymeric materials containing free amino groups can also be made to react with certain coumarin derivatives. Among these polymeric materials can be mentioned for instance gelatin, poly(vinyl amine), poly(aminostyrene), and polyesters bearing free amino substituents along the main polymeric chain.

Polymeric materials comprising thiol groups e.g., thiolated gelatin, poly(thiolstyrene), poly(vinyl mercaptan), and the condensation product of poly(isophthalylidene-hexamethylenediamine) and thioglycolic acid as described in Example 5 of the Belgian patent specification 622,556 are useful also.

As courmarin group-containing compounds which can be made to react with natural and synthetic polymeric materials may be mentioned for instance: 7-hydroxycoumarin, 6-carboxycoumarin, 7-aminocoumarin, 6-chlorocarbonyl-coumarin, 6-chlorosulphonyl-coumarin, 7-(m-carboxyphenyl)sulphonyl-oxycoumarin, 7-(m-chlorocarbonylphenyl)-sulphonyl-oxycoumarin, and the like.

Cross-linking of the light-sensitive polymeric composition can be effected to some extent by simply exposing the light-sensitive polymeric composition to a source emitting actinic light rays. However, in order to obtain the optimum degree of insolubilization as well as faster reaction, it is preferred to effect the reaction in the presence of catalytic amount of one or more sensitizers. Examples of suitable sensitizers are Michler's ketone, p-dimethylaminoacetophenone and p-dimethylaminobenzophenone.

The polymeric materials may be exposed to actinic light from any source and of any type. The light source should preferably, though not necessarily, furnish an effective amount of ultraviolet radiation. Suitable light sources include carbon arcs, mercury vapor lamps, fluorescent lamps, argon glow lamps, photographic flood lamps and tungsten lamps.

For initiating the photochemical cross-linking a very strong light source is not required. Indeed, in most examples described hereinafter an 80 watt mercury vapor lamp placed at a disance of about 15 cm. from the surface to be polymerized, is used. Brighter light sources are generally not needed since at these relatively low light intensities the protochemically cross-linking influence of the coumarin groups is found to be strong enough.

In the photochemical insolubilization of light-sensitive polymeric compositions comprising coumarin groups, high temperatures are not needed.

It has been found that polymeric compositions comprising coumarin groups are light-sensitive in the sense that their exposure to light causes them to be rendered insoluble. Thus, if a layer of one of such initially soluble light-sensitive polymeric compositions is applied to a support and exposed photographically, the exposed areas become insoluble.

The invention is valuable in forming plates and films wholly made of the light-sensitive polymeric composition. The light-sensitive compositions can also be used in the formation of coated printing films on any base by deposition according to any known process of films or coatings of the light-sensitive polymeric composition. Suitable bases are metal sheets (e.g., copper, aluminum, zinc, etc.), paper, glass, cellulose ester film, poly(vinyl acetal) film, poly(styrene) film, poly(ethylene terephthalate) film, nylon and metal screens, etc.

The base or support can be coated with a solution of the light-sensitive polymeric composition in a suitable solvent, the solvent or solvent mixture then being eliminated by known means such as evaporation, thus leaving a more or less thin coating of the light-sensitive polymeric composition upon the base or support. The light-sensitive coating is then ready for exposure to actinic light rays.

When a base or support component is used, which is light-reflecting, there may be present, e.g., superposed on said base or support component and adherent thereto or in the surface thereof, a layer or stratum absorptive of actinic light such as to minimize reflectance from the support of incident actinic light.

If the light-sensitive polymeric composition is water-soluble, water may be used as a solvent in coating the support. If use is made of light-sensitive polymeric compositions, which on the contrary are insoluble in water, organic solvents, mixtures of organic solvents, or mixtures of organic solvents and water can be used.

Plates formed wholly of or coated with the light-sensitive polymeric compositions are useful in photography, photomechanical reproduction, lithography and intaglio printing. More specific examples of such uses are offset printing, silk screen printing, duplicating pads, manifold stencil sheeting coatings, lithographic plates, relief plates, and gravure plates. The term "printing plates" as used in the claims is inclusive of all of these and thus includes both flexible material (e.g., self-sustaining layers of the said composition or sheet material comprising a layer or such composition on paper or other flexible backing) as well as rigid materials comprising a rigid backing.

A typical procedure according to the invention for preparing a printing plate is as follows. A layer of the light-sensitive composition forming a self-sustaining film or sheet or applied as a coating to a backing, usually of metal, is exposed to light through a contacting process transparency, e.g., a process positive or negative (consisting solely of opaque and transparent areas and where the opaque areas are of the same optical density, the so-called line or half-tone negative or positive). The light induces the reaction which insolubilizes the areas of the surface beneath the transparent portions of the image, while the areas beneath the opaque portions of the image, remain soluble. The soluble areas of the surface are then removed by a developer and the insoluble raised portions of the film which remain can serve as a resist image, while the exposed base material is etched, forming a relief plate, or the plate can be inked and used as a relief printing plate directly in the customary manner.

After washing away the unexposed and consequently soluble portions of the light-sensitive layer or film, the polymer portions rendered insoluble by exposure to actinic light may be subjected, if desired, to other known hardening techniques. These hardening techniques depend, of course, upon the kind of light-sensitive polymer used. When, e.g., the original polymer is an epoxy resin obtained by the reaction of 2,2-bis(4-hydroxyphenyl) propane and epichlorhydrin, which epoxy resin has been modified with a coumarin derivative, the insolubilized polymer portions remaining after exposure and development may be hardened supplementarily according to hardening techniques known for epoxy resins.

The purpose of this additional hardening is to optimally strengthen the insolubilized polymer portions. If, e.g., the remaining insolubilized polymer surface is to be used as a printing plate, a similar subsequent hardening is very often desired.

The thickness of the light-sensitive layer is a direct function of the thickness required in the relief image and that depends on the subject being reproduced and particularly on the extent of the nonprinting areas. In the case of half-tones the nature of the screen used is also a factor to be taken into account. In general, the thickness of the light-sensitive layer is suitably within the range 0.001 mm. to about 7 mm. Layers ranging from about 0.001 to about 0.70 mm. in thickness are in general suitable, for half-tone plates. Layers ranging from about 0.25 to about 1.50 mm. in thickness are in general suitable for the majority of letter-press printing plates including those wherein half-tone and line images are to be combined.

If the light-sensitive polymeric composition is to be applied to a metal support, the polymeric material can very suitably be selected from poly(vinyl butyral) and polyepoxy resins, the high adherence of which to metals is a well-known fact.

The solvent liquid used for washing or "developing" the printing plates made from the light-sensitive polymeric composition must be selected with care, since it should manifest good solvent action on the unexposed areas, yet have little action on the hardened image or upon any base material, antihalation layer, or subbing layer by which the light-sensitive polymeric composition may be anchored to the support.

The light-sensitive polymeric compositions of the present invention are suitable for other purposes in addition to the printing uses descrbed above.

The surface of a film or layer of a somewhat sticky light-sensitive polymeric composition can be treated with a powder after imagewise exposure to light. The exposed areas are hardened and have lost their thickness. As a consequence the powder is taken up only by the unexposed areas and the powder-image thus formed can be used in transfer processes.

The light-sensitive polymeric compositions are suitable for other purposes as well, e.g., as ornamental plaques or for producing ornamental effects; as patterns for automatic engraving machines, foundry moulds, cutting and stamping dies, name stamps, relief maps for braille; as rapid cure coatings, e.g., on film base; as sound tracks on film; for embossing plates, paper, e.g., with a die prepared from the photopolymerizable compositions; in the preparation of printed circuits; and in the preparation of other plastic articles.

The light-sensitive polymeric substances of the invention can be utilised as ultraviolet curing catalysts for systems where low heat application is a requirement in the curing of a particular part, and sunlight or other sources of ultraviolet light are readily available.

The following examples illustrate the present invention.

EXAMPLE 1.—POLY(7-ACRYLYLOXYCOUMARIN)

A. 7-hydroxycoumarin

In a three-necked flask fitted with a condenser measuring 1.5 m. and a thermometer, 55 g. of resorcin and 67 g. of malic acid are admixed with 140 cc. of sulphuric acid. The finely divided mixture is heated vigorously. At 130° C. the product solidifies and the temperature drops to 110° C. The mixture is then heated to 120° C. and from time to time thoroughly shaken. The reaction is continued till foam ceases to be formed.

After cooling with ice and standing for 1 h. the mixture is poured into ice water and after standing for 2 h. the slightly orange-colored product is collected. It is then boiled up for 30 min. in 400 cc. of water and 200 cc. of ethanol together with activated charcoal, recrystallized, sucked off, and dried. Melting point approximately 228° C.

B. 7-acrylyloxycoumarin

In a flask fitted with a stirrer, a condenser, a thermometer and a calcium chloride tube 8.1 g. of 7-hydroxycoumarin are dissolved in 80 cc. of diethylaniline.

The mixture is heated at 120° C. till complete dissolution. It is then cooled to 100° C. and 80 mg. of m-dinitrobenzene are added as inhibiting agent whereupon 6.34 g. of acrylic acid chloride are added likewise.

Immediately a clear solution is obtained which after stirring for 15 min. at approximately 95° C. is cooled to 50° C. and poured into 1 l. of 2 N hydrochloric acid. The precipitate is sucked off and washed in a minimum amount of acetone and precipitated again in 1 l. of N sodium carbonate. After stirring for 10 min. the precipitate is sucked off and washed till neutral, next dissolved again in acetone, and finally precipitated in 1 l. of N hydrochloric acid. After sucking off and thoroughly washing of the product, it is dried in vacuo. Melting point 136° C.

C. Poly(7-acrylyloxycoumarin)

A solution of 0.5 g. of 7-acrylyloxycoumarin and 5 mg. of azobisisobutyronitril in 5 cc. of dimethylformamide is prepared. Polymerization occurs at 80° C. in a sealed pressure tube after rinsing with nitrogen.

After polymerization for 6 h. the polymer is precipitated in acetone, washed and dried in vacuo.

D. Photochemical insolubilization

An amount of 125 mg. of the above-prepared poly(7-acrylyloxycoumarin) is dissolved in 2.5 cc. of dimethylformamide together with 5 mg. of Michler's ketone. This solution is applied to an aluminum foil such that after evaporation of the solvent a layer of about 1$\mu$ in thickness is left.

A negative process transparency is laid upon said layer. The resulting sandwich is exposed for a definite time to a 80 watt mercury vapor lamp at a distance of 15 cm. Subsequently the unexposed portions of the layer are washed away with dimethylformamide. An exposure time of ½ min. is required in order to obtain a good relief image.

EXAMPLE 2

A. Copolymer of 7-acrylyloxycoumarin and ethyl acrylate

In a pressure tube are placed 1 g. of 7-acrylyloxycoumarin as prepared in Example 1B, 1 g. of freshly distilled ethyl acrylate and 20 mg. of benzoyl peroxide in 20 cc. of anhydrous dimethylformamide.

The pressure tube is rinsed with nitrogen and subsequently sealed and heated for 6 h. at 80° C. in an oil thermostat. The solution is then concentrated and the copolymer which consists of 50% of 7-acrylyloxycoumarin units and 50% of ethyl acrylate units is precipitated in methanol, washed and dried in vacuo.

B. Photochemical insolubilization 125 mg. of the copolymer prepared as described above are dissolved in 2.5 cc. of butanone together with 5 mg. of Michler's ketone. This solution is applied to an aluminum foil such that on drying a layer of 1$\mu$ in thickness is obtained.

This light-sensitive layer is exposed through a process transparency at a distance of 15 cm. to a 80 watt mercury vapor lamp. The unexposed areas are washed away with butanone. An exposure time of 1 min. is required for obtaining a good relief image.

EXAMPLE 3

A. 6-chlorosulphonyl-coumarin

In a three-necked flask fitted with a condenser and a thermometer, 50 g. of coumarin are added to 200 g. of chlorosulphonic acid whilst cooling. After a reaction of 4 h. at 100° C. the mixture is cooled and poured on ice. The product deposits and is washed 4 times with water. It is then recrystallized from dichloroethane, sucked off, and dried in vacuo. Melting point 116–117° C.

B. Copolymer of vinyl butyral and 6-coumarin vinyl sulphonate 9.18 g. of poly(vinyl butyral) having 20% of free hydroxyl groups are dissolved in 90 cc. of pyridine. Subsequently 5.46 g. of 6-chlorosulphonyl-coumarin are added to this sloution whilst keeping in the dark. After total dissolution the mixture is left standing in the dark for approximately 60 h. The reaction mixture is next diluted with methanol and the polymeric material is precipitated in water. After washing with water the copolymer is dried in vacuo. The copolymer comprises 88 mole percent of vinyl butyral units and 12 mole percent of 6-coumarin-vinyl sulphonate units.

C. Photochemical insolubilization 0.025 g. of the above copolymer is dissolved in 2 $cm.^3$ of methylene chloride and 1 $cm.^3$ of sym.-tetrachloroethane, together with 2.5 mg. of Michler's ketone. In accordance with the method described in Example 1D, this solution is applied to an aluminum, copper or zinc plate, exposed to an 80 watt mercury vapor lamp at a distance of 15 cm., and developed. An exposure time of 20 sec. is required for obtaining a good relief image. If a common 300 watt lamp is employed instead of the 80 watt mercury vapor lamp which furnishes ultraviolet light rays, an exposure time of 2 min. is needed.

EXAMPLE 4

A. 6-chlorocarbonyl-coumarin 6-carboxycoumarin is prepared according to the method of R. Stoermer and E. Oetker described in Berichte, 37 (1904), 192. 3.5 g. of 6-carboxycoumarin are added to 20 $cm.^3$ of thionyl chloride. After a reaction time of 1 h. at reflux temperature, the surplus thionyl chloride is distilled over. The product obtained is crystallized in hexane.

B. Reaction product of the polyether of 2,2-bis(4-hydroxyphenyl)propane and epichlorhydrin with 6-chlorocarbonyl-coumarin 1.42 g. of the polyether obtained by making 2,2-bis(4-hydroxyphenyl)propane react with epichlorhydrin are dissolved in 20 $cm.^3$ of pyridine and 1.04 g. of 6-chlorocarbonyl-coumarin is added thereto. The mixture is heated at 80° C. on an oil bath.

The polymer is precipitated in 500 $cm.^3$ of ethanol, washed twice with ethanol and ether, filtered and dried in vacuo. Analysis of the resulting product proves that approximately 50% of the free hydroxyl groups are modified into coumarin substituents.

C. Photochemical insolubilization

Analogously to the process described in Example 1D the above modified polyether is applied to an aluminum foil, exposed to an 80 watt mercury vapor lamp through a process transparency, developed and dried. An exposure time of 1 min. is required for obtaining a good relief image.

EXAMPLE 5

A. 7-(m-carboxyphenyl)sulphonyl-oxycoumarin 8.1 g. of 7-hydroxycoumarin prepared as described in Example 1A are added at 0° C. to a solution of 2 g. of N sodium hydroxide in 40 $cm.^3$ of water. At 0° C. both following solutions are added simultaneously:

(1) 2 g. of sodium hydroxide in 20 $cm.^3$ of water, (2) 11 g. of m-chlorosulphonylbenzoic acid in 20 $cm.^3$ of acetone.

The resulting precipitate is sucked off and redissolved in warm water. The precipitate is acidified, sucked off, and recrystallized from a mixture of 75 $cm.^3$ of water and 300 $cm.^3$ of ethanol. Melting point 235° C.

B. 7-(m-chlorocarbonylphenyl)-sulphonyl-oxycoumarin 4 g. of 7-(m-carboxyphenyl) - sulphonyl - oxycoumarin are refluxed in 40 $cm.^3$ of thionyl chloride. The solution is then refluxed until complete dissolution. Subsequently the surplus thionyl chloride is evaporated and the acid chloride is recrystallized from 40 $cm.^3$ of benzene. Melting point 140° C.

C. Reaction product of the polyether of 2,2-bis(4-hydroxyphenyl)propane and epichlorhydrin with 7-(m-chlorocarbonylphenyl)sulphonyl-oxycoumarin 1.42 g. of the polyether of 2,2-bis(4-hydroxyphenyl) propane and epichlorohydrin are dissolved in 20 $cm.^3$ of pyridine. To the solution 1.9 g. of 7-(m-chlorocarbonylphenyl)sulphonyloxycoumarin are added and the resulting mixture is made to react in the dark at 90–100° C. for 4 h.

After cooling down to room temperature the polymer is precipitated in ethanol. Finally the polymer is washed in ethanol and ether and dried in vacuo.

D. Photochemical insolubilization

Same procedure as in Example 1D with the proviso that a mixture of 2 parts of methylene chloride and 1 part of sym.-tetrachloroethane is used as a solvent for the above-described modified polyether and as a developing agent after exposure to an 80 watt mercury vapor lamp. An exposure time of 1 min. is required for obtaining a good relief image.

EXAMPLE 6

A. Reaction product of the polyether of 2,2-bis(4-hydroxyphenyl)propane and epichlorhydrin with 6-chlorosulphonyl-coumarin To 2.8 g. of the polyether obtained by reaction of 2,2-bis(4-hydroxyphenyl)propane and epichlorhydrin are added 3.63 g. of 6-chlorosulphonyl-coumarin as prepared according to Example 3A.

The mixture is allowed to react for 24 h. at room temperature. After dilution with methylene chloride the polymer is precipitated in ethanol, washed in ethanol, and dried in vacuo.

B. Photochemical insolubilization

Same procedure as in Example 1D with the proviso, that a mixture consisting of 2 parts of methylene chloride and 1 part of sym.-tetrachloroethane is used as a solvent for the above described modified polyether, and as a developing agent after exposure to an 80 watt mercury vapor lamp at a distance of 15 cm. An exposure time of 45 sec. is required for obtaining a good relief image.

In the same way as described in the foregoing examples, coumarin compounds, e.g., 6-chlorosulphonyl-coumarin can be made to react with a polyester compound, which still bears free reactive groups, e.g., with the polyester of 5-hydroxyisophthalic acid and 2,2-bis(4-hydroxyphenyl)propane, and the modified polyesters can be utilised in forming a light-sensitive layer. Gelatin may as well be made to react with the same coumarin compound and the resulting modified polymer can be employed as light-sensitive substance.

In order to trace the influence of some sensitizing agents the following tests have been executed.

EXAMPLES 7–10

The photochemical insolubilisation technique of Example 6B is repeated with different samples of the same polymer with the proviso, however, that Michler's ketone is replaced by sensitizing agents. The results are listed in the following table.

| Example | Sensitizing agent | Required exposure time |
|---|---|---|
| 7 | Without sensitizing agent | 4 min. |
| 8 | p-Dimethylaminobenzophenone | 45 sec. |
| 9 | p-Dimethylaminobenzaldehyde | 45 sec. |
| 10 | p-Dimethylaminoacetophenone | 2 min. |

EXAMPLES 11–28

The influence of the concentration of sensitizing agent may be traced as well. The process of Example 6B is repeated therefor with the proviso, however, that the amount of Michler's ketone added is changed. The results are listed in the following table.

| Example | Percent of sensitizing agent with respect to the amount of polymer | Required exposure time |
|---|---|---|
| 11 | 0.6 | 8 min. |
| 12 | 1.25 | 3 min. |
| 13 | 2.5 | 2 min. |
| 14 | 5 | 2 min. |
| 15 | 10 | 1¾ min. |
| 16 | 15 | 3 min. |
| 17 | 20 | 3 min. |
| 18 | 50 | 4 min. |
| 19 | 100 | 8 min. |
| 20 | (1) | 8 min. |
| 21 | 0.6 | 45 sec. |
| 22 | 1.25 | 30 sec. |
| 23 | 2.5 | 20 sec. |
| 24 | 5 | 20 sec. |
| 25 | 10 | 20 sec. |
| 26 | 15 | 20 sec. |
| 27 | 20 | 20 sec. |
| 28 | 50 | 20 sec. |
| 29 | 100 | 30 sec. |

1 Without sensitizing agent.

In Examples 11 to 19 a modified polyether containing 10 mole percent of 6-sulphonyl-coumarin is used, whereas Examples 20 to 29 are concerned with modified polyethers containing 60 mole percent of 6-sulphonyl-coumarin. These modified polyethers have been prepared according to the method described in Example 6.

The experimental results listed in the above table point to a rapidly increasing sensitisation effect for very low concentrations of sensitizing agent. It should be remarked, however, that the maximum increase in light-sensitivity obtained with 2.5% of sensitizing agent calculated on the amount of polymer is scarcely exceeded with higher concentrations of sensitizing agent. With polyethers comprising more than 10 mole percent of 6-sulphonyl-coumarin (Examples 16–19) a considerable decrease in light-sensitivity is encountered.

EXAMPLES 30–34

The influence of the percentage of coumarin groups can be studied as well. The polyether of 2,2-bis(4-hydroxyphenyl)propane and epichlorhydrin is modified with different amounts of 6-chlorosulphonyl-coumarin according to the method described in Example 6A. The procedure of Example 6B is then followed. The results are listed in the following table.

| Example | Mole percent of 6-sulphonyl-coumarin in polyether | Required exposure time |
|---|---|---|
| 30 | 96 | 30 sec. |
| 31 | 60 | 30 sec. |
| 32 | 35 | 1 min. |
| 33 | 10 | 2 min. |
| 34 | 6.5 | 4 min. |

It is to be noticed that the light-sensitivity of the polymer gradually increases till concentrations of 50 mole percent of 6-sulphonyl-coumarin groups are reached and remains practically unchanged with higher substitution rates.

In the foregoing description reference has been made to exposure of "selected portions" of the photo-sensitive recording material and while reproduction processes will normally be performed by first exposing the said material through a process transparency, i.e., diapositive or other subject comprising transparent and opaque areas, it is to be understood that a subject can be recorded by exposure of the recording material differentially to light, e.g., as by projecting light through an image-bearing sheet which allows light to pass even to the areas of the recording material where the polymeric substance must remain soluble but which restricts the amount or intensity of light incident on these areas to a value insufficient for effectively cross-linking the polymer. Reference to exposure of selected portions of the photosensitive material is therefore to be read in the sense of "effective exposure" of selected portions of such material.

Similarly, reference herein to the solubility and insolubility of a polymer at successive stages of a recording process must obviously be regarded as including respectively degrees of solubility sufficiently different to render the process operative provided a suitable solvent is used under suitable conditions.

EXAMPLE 35

A. 6-[3,5-di(chlorocarbonyl)phenoxysulphonyl]coumarin

In a flask fitted with a stirrer, a thermometer and a dropping funnel are placed:

| | | |
|---|---|---|
| 5-oxyisophthalic acid (0.02 mole) | g | 3.64 |
| Sodium hydroxide | g | 2.8 |
| Water | ml | 50 |

The mixture is cooled to about 5° C. whereupon a solution of 4.85 g. of 6-chlorosulphonyl-coumarin (0.02 mole) in 30 cc. of acetone is dropwise added. The mixture is stirred for 30 min. and then acidified with 5 ml. of strong hydrochloric acid and 20 cc. of water. The precipitate formed is filtered by suction, washed with water and dried at 100° C. Yield, 5 g. of 6-(3,5-dicarboxylphenoxysulphonyl)coumarin.

5 g. of this product are added to 25 cc. of thionyl chloride and the mixture is refluxed for 2 hours whereupon the excess of thionyl chloride is volatilized. The residue is recrystallized from 75 cc. of hexane and 25 cc. of benzene. Yield, 4 g. of 6-[3,5-di-n(chlorocarbonyl)phenoxysulphonyl]coumarin.

B. Polyester of 2,2-bis-(4-hydroxyphenyl)propane and 6-[3,5-di(chlorocarbonyl)phenoxysulphonyl]coumarin In a three-necked flask fitted with a stirrer and dropping funnel are placed:

| | | |
|---|---|---|
| 6-[3,5-di(chlorocarbonyl)phenoxysulphonyl]coumarin (0.005 mole) | g | 2.135 |
| Triethyl benzyl ammonium chloride | g | 0.1 |
| Methylene chloride | cc | 15 |

While strongly stirring a solution of 1.14 g. of 2,2-bis(4-hydroxyphenyl)propane (0.005 mole) in 10 cc. of 1 N sodium hydroxide is dropwise added whereupon stirring is continued for 1 hour. The aqueous layer is decanted and the viscous mass is washed with water, diluted with methylene chloride and dried under reduced pressure.

C. Photochemical insolubilization 25 mg. of the coumarin group-containing polyester described above are dissolved in a mixture of 2 cc. of methylene chloride and 1 cc. of sym.-tetrachloroethane together with 2.5 mg. of Michler's ketone. As described in Example 1D this solution is applied to an aluminum plate, exposed to an 80 watt mercury vapor lamp placed at a distance of 15 cm. and developed in a mixture of methylene chloride and sym.-tetrachloroethane (50:50). An exposure-time of 30 minutes is required for obtaining a good relief image.

EXAMPLE 36

A. Derivative of gelatin and 6-chlorosulphonyl-coumarin 50 g. of gelatin are dissolved in 450 cc. of water at 50° C. and pH 10 whereupon 6-chlorosulphonyl-coumarin (see Example 3A) dissolved in 50 cc. of dimethylformamide is dropwise added. After 30 min. of reaction the pH is adjusted to 7 by addition of hydrochloric acid.

The gelatin derivative is precipitated with acetone and the acetone is decanted. The product is redissolved in water and solidified, noodled and dried according to known methods.

B. Photochemical insolubilization 50 g. of the gelatin derivative described above and 5 mg. of p-dimethylaminobenzaldehyde are dissolved in 5 cc. of water. As described in Example 1D the solution formed is applied to an aluminum plate, exposed to an 80 watt mercury vapor lamp placed at a distance of 15 cm. and developed with water. An exposure time of 5½ minutes is required for obtaining a good relief image.

What we claim is:

1. A process for producing a printing element which comprises exposing a photographic element to actinic light through a process transparency, said photographic element comprising a light-sensitive layer comprising a soluble polymer carrying coumarin substitutents, whereby in the exposed areas the said polymer is cross-linked to the insoluble state, and soluble polymer in the unexposed areas is removed with a solvent therefor, thereby forming a raised image on said photographic element.

2. A process according to claim 1 wherein the said soluble polymer carrying coumarin substituents is obtained by homopolymerization or copolymerization of one or more ethylenically unsaturated monomers carrying coumarin substituents.

3. A process according to claim 2 wherein the said soluble polymer carrying coumarin substituents is obtained by homopolymerization or copolymerization of 7-acrylyloxycoumarin.

4. A process according to claim 3 wherein the said soluble polymer carrying coumarin substituents is a copolymer of 7-acrylyloxycoumarin and ethyl acrylate.

5. A process according to claim 1 wherein the said soluble polymer carrying coumarin substituents is obtained by reaction of polymers containing free hydroxyl groups, amino groups or thiol groups with one or more coumarin group-containing compounds containing groups reactive with the said free hydroxyl, amino, or thiol groups.

6. A process according to claim 5 wherein the said soluble polymer carrying coumarin substituents is obtained by reaction of polyvinyl butyral containing free hydroxyl groups with 6-chlorosulphonyl-coumarin.

7. A process according to claim 5 wherein the said soluble polymer carrying coumarin substituents is obtained by reaction of the polyether of 2,2-bis(4-hydroxyphenyl)propane and epichlorohydrin and 6-chlorocarbonyl-coumarin.

8. A process according to claim 5 wherein the said soluble polymer carrying coumarin substituents is obtained by reaction of the polyether of 2,2-bis(4-hydroxyphenyl)propane and epichlorohydrin with 6-chlorosulphonyl-coumarin.

9. Process for photochemical insolubilization of polymers having coumarin substituents which comprises exposing to actinic light select portions of a light-sensitive polymeric composition comprising a soluble polymeric material which is the reaction product of a polymer containing X groups and a coumarin-containing compound having Y groups reactive with said X groups, said reaction product being formed through the reaction of said X and Y groups, and thereafter removing the soluble polymer in the unexposed areas with a solvent therefor.

10. A printing element comprising a support and carrying on said support a raised image comprising an insoluble and infusible polymer having coumarin substituent moieties.

References Cited

UNITED STATES PATENTS 3,193,536 7/1965 Wagner et al. ------- 96—115 X

NORMAN G. TORCHIN, *Primary Examiner.*

R. E. MARTIN, *Assistant Examiner.*

U.S. Cl. X.R.

96—36.4, 115